United States Patent [19]
Lagerström

[11] Patent Number: 5,706,301
[45] Date of Patent: Jan. 6, 1998

[54] LASER WAVELENGTH CONTROL SYSTEM

[75] Inventor: Bo E. Lagerström, Skärholmen, Sweden

[73] Assignee: Telefonaktiebolaget L M Ericsson, Stockholm, Sweden

[21] Appl. No.: 515,560

[22] Filed: Aug. 16, 1995

[51] Int. Cl.$^6$ ........................................... H01S 3/13
[52] U.S. Cl. ........................... 372/32; 372/34; 372/38
[58] Field of Search ............................. 372/32, 34, 38

[56] References Cited

U.S. PATENT DOCUMENTS

| | | |
|---|---|---|
| 4,726,011 | 2/1988 | Ih et al. . |
| 4,977,565 | 12/1990 | Shimosaka . |
| 5,077,816 | 12/1991 | Glomb et al. . |
| 5,136,600 | 8/1992 | Fidric et al. ........................ 372/32 |
| 5,185,643 | 2/1993 | Vry et al. ........................... 372/32 |
| 5,208,819 | 5/1993 | Huber . |
| 5,278,687 | 1/1994 | Jannson et al. . |
| 5,283,845 | 2/1994 | Ip . |
| 5,287,367 | 2/1994 | Yamagawa ....................... 372/32 |
| 5,299,212 | 3/1994 | Koch et al. ....................... 372/32 |
| 5,319,435 | 6/1994 | Melle et al. . |
| 5,347,525 | 9/1994 | Faris . |
| 5,375,181 | 12/1994 | Miller et al. . |
| 5,553,087 | 9/1996 | Telle .................................. 372/32 |

FOREIGN PATENT DOCUMENTS

| | | |
|---|---|---|
| 0 284 908 | 10/1988 | European Pat. Off. . |
| 0 481 242 | 4/1992 | European Pat. Off. . |
| 0 481 252 A2 | 4/1992 | European Pat. Off. . |
| 61-89527 | 7/1986 | Japan . |
| 62-128184 | 10/1987 | Japan . |

OTHER PUBLICATIONS

Mao et al, "Laser Wavelength Stabilization Using Holographic Filters", IEEE/LEOS Summer Topical Meeting on Optical Networks and Their Enabling Technologies, Jul. 11–13, 1994.

Cavaleiro et al., "Referencing Technique For Intensity-based Sensors Using Fibre Optic Bragg Gratings", *Electronic Letters*, Mar. 2, 1995, vol. 31, No. 5, pp. 392–394.

Mizrahi et al., "Optical Properties of Photosensitive Fiber Phase Gratings", *Journal of Lightwave Technology*, vol. 11, No. 10, Oct. 1993, pp. 1513–1517.

Lyu et al., "Four–Channel Frequency Locking Using Back–Reflection Dips of a Fibre–Fed Fabry–Perot Filter", *Electronics Letters*, Jan. 19, 1995, vol. 31, No. 2, pp. 121–122.

Patent Abstracts of Japan, vol. 010, No. 264, (P–495) [2320], 9 Sep. 1986 & JP–A–61 089527 (NEC Corp) 7 May 1986—abstract.

Patent Abstracts of Japan, vol. 011, No. 351 (E–557) [2798], 17 Nov. 1987 & JP–A–62 128184 (Yokogawa Electric Corp) 10 Jun. 1987—abstract.

*Primary Examiner*—Rodney B. Bovernick
*Assistant Examiner*—Robert E. Wise
*Attorney, Agent, or Firm*—Nixon & Vanderhye P.C.

[57] ABSTRACT

A laser wavelength control system (20) stabilizes laser output wavelength. The control system includes a reflector/filter device (40) upon which laser radiation is incident for yielding both a filtered-transmitted signal (FS) and a reflected signal (RS). A controller (45) uses both the filtered-transmitted signal (FS) and the reflected signal (RS) to generate a control signal (CS). The control signal is utilized by a temperature converter (100) to adjust laser output wavelength of the laser (22). In one embodiment, the reflector/filter device is an optical fiber grating. The wavelength control system facilitates construction of a modular optical multichannel transmission system (200).

14 Claims, 7 Drawing Sheets

LASER WAVELENGTH CONTROL SYSTEM

BACKGROUND

1. Field of Invention

This invention pertains to method and apparatus for controlling laser output wavelength, and particularly to locking laser output wavelength.

2. Related Art and Other Considerations

Lasers are employed in many applications wherein it is typically required that the laser output wavelength be stabilized, e.g., locked to a reference wavelength. For example, in an optical multichannel system with narrow channel spacing, laser transmitter wavelengths must be stabilized and locked to a reference wavelength. The required accuracy of the locking depends on numerous factors in such a multichannel system, including channel spacing and specified transmission properties such as bit rate, number of a channels, crosstalk, distortion and receiver filter characteristics. In fact, the number of channels in such a multichannel system becomes a trade off between a useful optical amplifier window and the required transmission properties.

Laser output wavelength stabilization is complicated by the fact that laser output wavelength is usually a function of factors such as fluctuating laser operating temperature. Accordingly, techniques for wavelength locking have been developed. One such technique, described in Lyu, G. Y., and Park, C. S., "Four-channel Frequency Locking Using Back-Reflection Dips of a Fibre-Fed Fabry-Perot Filter", *Electron. Lett.*, 1995 31, (2), pp. 121–122, employs dithering of laser currents together with a frequency comb from a fiber-fed Fabry-Perot (FFP) filter to enable all channels to use the same reference wavelength but to lock to its own specific peak in the filter.

Other laser stabilization techniques require structures such as a hologram-creating crystal or an etalon. For example, in Mao et al., "Laser Wavelength Stabilization Using Holographic Filters", reflected light from a hologram-creating crystal is split and focused on two differing photodetectors, the relative amplitudes of the photodetectors being proportional to wavelength position. In U.S. Pat. No. 5,283,845 to Ip, a piezo actuator tunes a transmitted wavelength of an etalon to that of an external source.

Fiber optical gratings have previously been employed for laser tuning. U.S. Pat. 5,077,816 to Glomb et al. concerns a dithering technique wherein laser output is applied to a fiber grating. Only radiation transmitted by the fiber grating is utilized for tuning the laser, such tuning being based on peaks in the grating transfer function.

Fiber optical gratings have also been employed for other purposes, such as for developing reference signals for sensors (Cavaleiro et al., "Referencing Technique For Intensity-based Sensors Using Fibre Optic Bragg Gratings", *Electronic Letters*, Mar. 2, 1995, Vol. 31, No. 5, pp. 392–394) and evaluating waveguide wavelength (U.S. Pat. No. 5,319,435 to Melle et al.).

What is needed is a laser wavelength control system which simply yet precisely provides a stabilized laser wavelength. Accordingly, it is an object of the present invention to provide an accurate laser wavelength control system.

An advantage of the present invention is the provision of a laser wavelength control system which can be employed in an optical multichannel transmission system.

SUMMARY

A laser wavelength control system stabilizes laser output wavelength. The control system includes a reflector/filter device upon which laser radiation is incident for yielding both a filtered-transmitted signal and a reflected signal. A controller uses both the filtered-transmitted signal and the reflected signal to generate a control signal. The control signal is utilized by a temperature converter to adjust laser output wavelength of the laser. In one embodiment, the reflector/filter device is an optical fiber grating. The wavelength control system facilitates construction of a modular optical multichannel transmission system.

BRIEF DESCRIPTION OF THE DRAWINGS

The foregoing and other objects, features, and advantages of the invention will be apparent from the following more particular description of preferred embodiments as illustrated in the accompanying drawings in which reference characters refer to the same parts throughout the various views. The drawings are not necessarily to scale, emphasis instead being placed upon illustrating the principles of the invention.

DETAILED DESCRIPTION OF THE DRAWINGS

Figure 1:
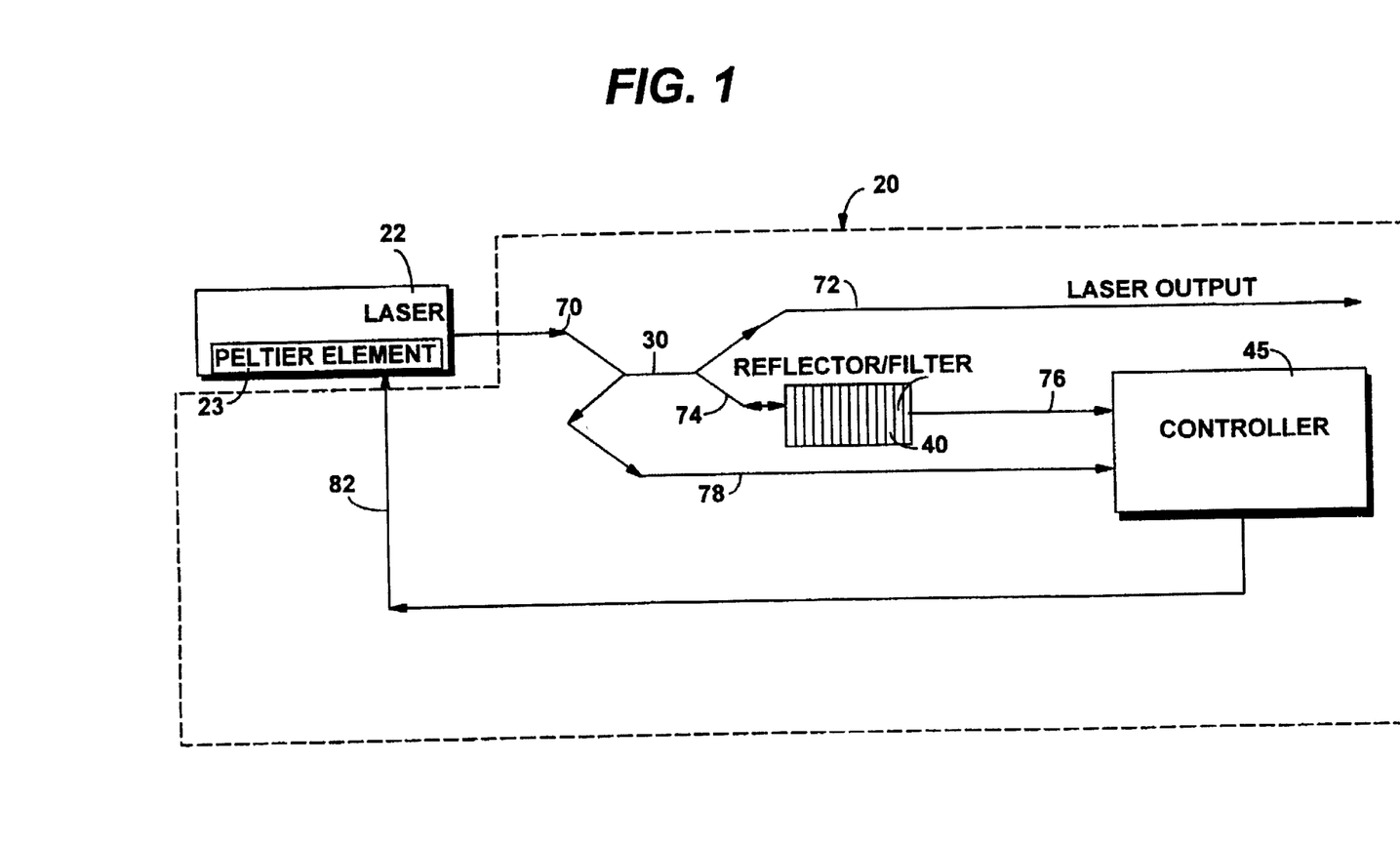
FIG. 1 is a schematic view of a laser wavelength control system according to an embodiment of the invention.

FIG. 1 shows a laser wavelength control system 20 for controlling the wavelength of radiation generated by laser 22. In the illustrated embodiment, laser 22 happens to be an distributed feedback, electro absorption (EA-DFB) laser, although it will be understood that other types of lasers can also be employed. In conventional manner, laser 22 includes a Peltier element 23. The function of control system 20 is to lock the output wavelength of laser 22 to a predetermined locking wavelength $\lambda_o$.

Laser wavelength control system 20 includes coupler/splitter 30; reflector/filter device 40; and controller 45. Radiation generated by laser 22 is transmitted by optical fiber 70 to coupler/splitter 30 where it is split into a laser output beam (transmitted by optical fiber 72) and a laser sample beam (transmitted by optical fiber 74). The laser sample beam is incident upon reflector/filter device 40, which in the illustrated embodiment is an optical fiber grating filter having a center wavelength at 1548.6 nm. Radiation filtered and transmitted by device 40 is further transmitted by optical fiber 76 to a first port of controller 45. Radiation reflected by device 40 is transmitted back through fiber 74 to coupler/splitter 30, and then directed via optical fiber 78 to a second port of controller 45. Controller 45 generates a laser temperature feedback signal "TEMP" on line 82 for adjusting the laser output wavelength of laser 22.

Figure 2A:
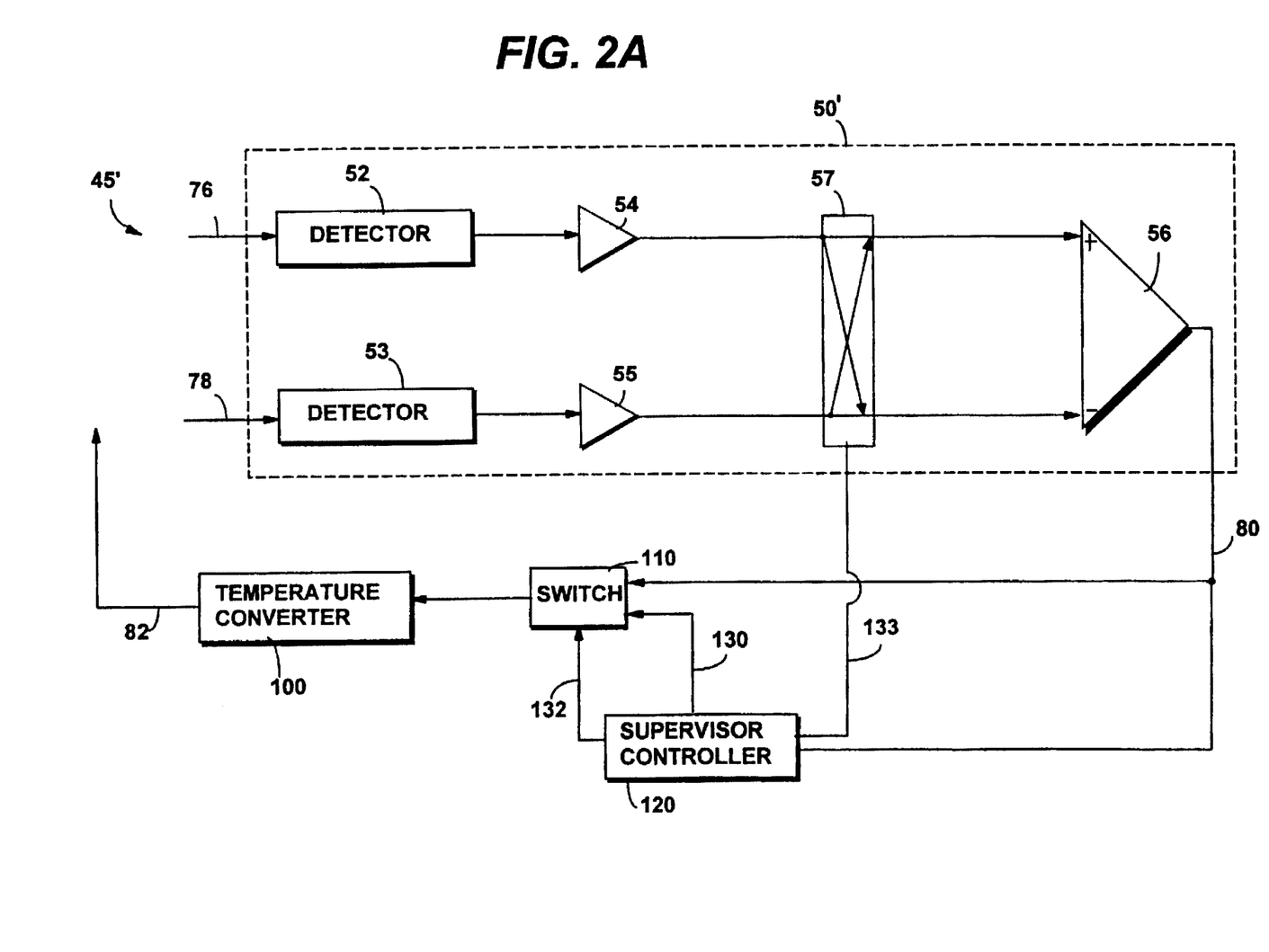
FIG. 2A is a schematic view of a first embodiment of a controller includable in the laser wavelength control system of FIG. 1.
Figure 2B:
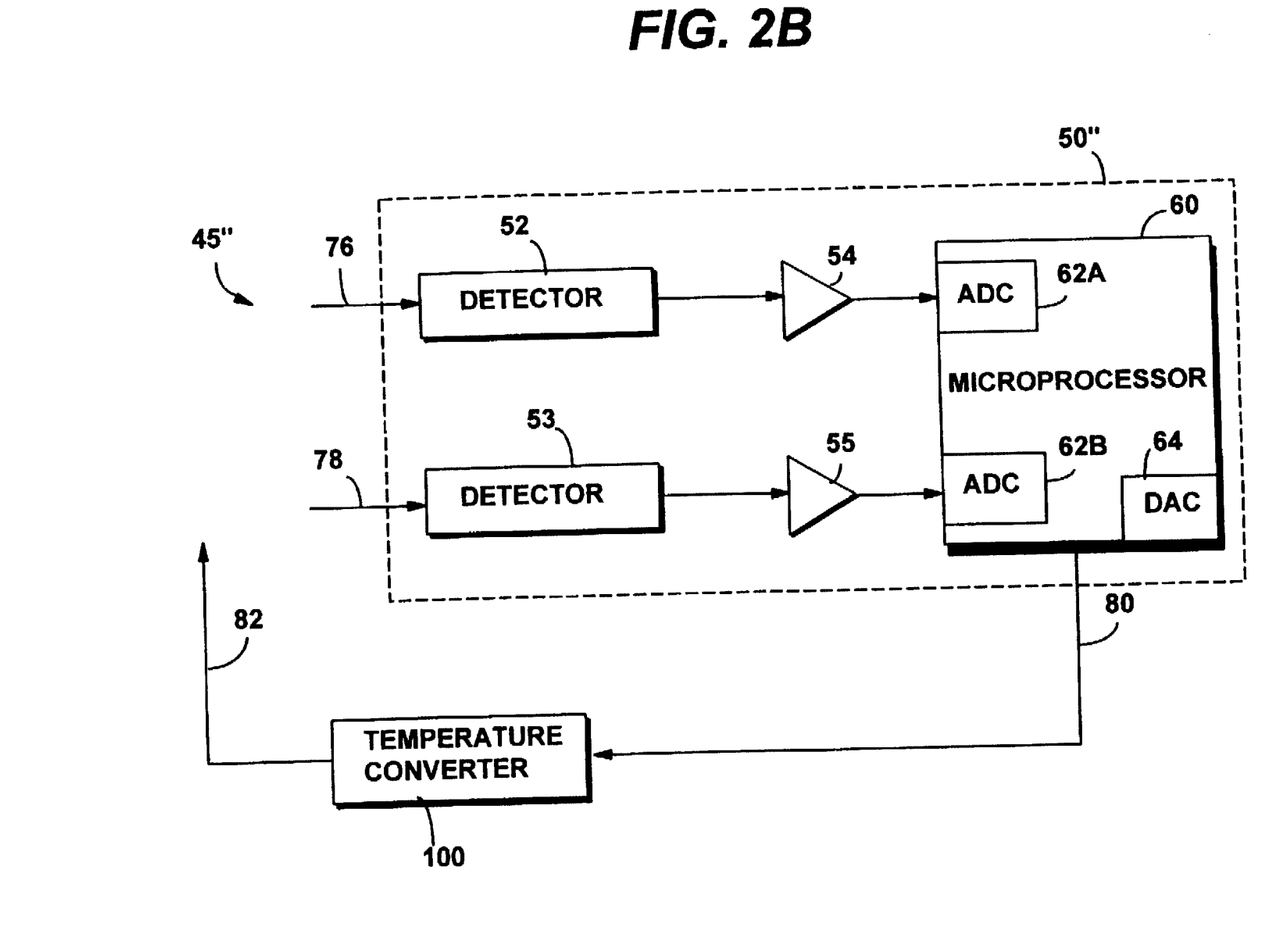
FIG. 2B is a schematic view of a second embodiment of a controller includable in the laser wavelength control system of FIG. 1.

Controller 45 can take several forms, including the form of controller 45' of FIG. 2A and the controller 45" of FIG. 2B. Whereas controller 45' of FIG. 2A is primarily an analog embodiment, controller 45" of FIG. 2B is predominantly a digital embodiment.

Both controller 45' of FIG. 2A and controller 45" of FIG. 2B include a signal processor 50 and a temperature converter 100. In particular, controller 45' of FIG. 2A includes signal processor 50' and temperature converter 100, as well as switch 110 and supervisor controller 120. Controller 45" of FIG. 2B includes signal processor 50" and temperature converter 100. As described hereinafter, the signal processors 50', 50" generate an analog control signal "CS" on line 80 for application to temperature converter 100. Temperature converter 100 is basically a voltage-to-current converter, which outputs a current signal "TEMP" in line 82 to Peltier element 23 of laser 22.

Both signal processor 50' of FIG. 2A and signal processor 50" of FIG. 2B include filtered signal detector 52 and reflected signal detector 53. Filtered signal detector 52 is aligned to detect the radiation transmitted by optical fiber 76 from reflector/filter device 40; reflected signal detector 53 is aligned to detect the radiation reflected by device 40 and transmitted back through fiber 74, coupler/splitter 30, and optical fiber 78. An output signal from detector 52 is applied to filtered signal amplifier 54 and an output signal from detector 53 is applied to reflected signal amplifier 55. As symbolically represented herein, the output signal from detector 52 is known as the filtered signal or "FS"; the output signal from the detector 53 is known as the reflected signal or "RS". Both the filter signal FS and the reflected signal RS are functions of wavelength, and accordingly are also denoted as $FS(\lambda)$ and $RS(\lambda)$, respectively.

Preferably, the gain "k" of reflected signal amplifier 55 is set so that, at the locking wavelength ($\lambda_o$), the magnitude of the reflected signal RS multiplied by gain constant k is equal to the magnitude of the filtered signal FS [i.e., $FS(\lambda_o)=k*RS(\lambda_o)$]. As seen hereinafter, setting the gain k in this manner advantageously permits tuning of laser 22 relative to a zero crossing point of control signal CS carried on line 80.

In the FIG. 2A embodiment, output terminals of amplifiers 54 and 55 are connected respectively via switch 57 to positive and negative input terminals of an analog circuit or analog device, such as balanced operational amplifier 56. In an active range or neighborhood hereinafter described, operational amplifier 56 compares the filtered signal FS and reflected signal RS to generate a control signal "CS" on line 80 for application to temperature controller 100. In the active range or neighborhood, operation amplifier is configured to generate control signal CS on line 80 in accordance with Equation 1:

$$CS(\lambda)=FS(\lambda)-k*RS(\lambda)$$ Equation 1 it being recalled that the output signal from detector 52 is "$FS(\lambda)$"; the output signal from the detector 54 is "$RS(\lambda)$"; and the gain of amplifier 55 is "k".

In the FIG. 2A embodiment, control signal CS on line 80 is selectively applied to temperature converter 100 via switch 110. Alternatively, switch 110 can apply to temperature converter 100 a supervisor-generated control signal on line 130. Supervisor controller 120 issues a selection signal on line 132 to control switch 110 for selecting between control signal CS on line 80 and the supervisor-generated control signal on line 130. Similarly, supervisory controller 120 issues a mode selection signal on line 133 to control switch 57 for initial selection between positive or negative slope mode of operation.

The signal processor 50" of the embodiment of FIG. 2B differs from signal processor 50' of FIG. 2A, e.g., in having output signals from amplifiers 54 and 55 applied directly to respective analog to digital converters (ADCs) 62A and 62B. ADCs 62A and 62B can be included in a microprocessor 60 (as shown in FIG. 2B), or connected between microprocessor 60 and respective amplifiers 54 and 55. Microprocessor 60 of FIG. 2B generates a digital version of the control signal CS using Equation 1 taking into consideration the slope mode. This digital version of CS is then converted by digital to analog converter (DAC) 64, resulting in the application of the analog control signal CS on line 80 to temperature controller 100. DAC 64 can be included in microprocessor 60 (as illustrated), or be connected between microprocessor 60 and temperature controller 100.

In connection with signal controller 50" of FIG. 2B, in the illustrated embodiment ADCs 62A and 62B each generate a 12 bit digital signal which is utilized by microprocessor 60 to generate the digital version of control signal CS. DAC 64, to which the digital version of control signal CS is applied, is an eight bit digital to analog converter. In generating its digital output signal, microprocessor 60 can execute a program wherein other feedback parameters (here not pertinent) are considered and optimized.

Temperature controller 100 is a conventional voltage to current converter which (as described above) receives at its set point terminal the (voltage) control signal CS on line 80. Temperature controller 100 outputs on line 82 a converted current signal (positive or negative current), known as the laser temperature feedback signal or TEMP, to Peltier element 23 included in laser 22. It is envisioned that other signals may be applied from controller 100 or elsewhere to laser 22, such as a laser current feedback signal.

The analog-converted output signal of signal processor 50, i.e., control signal CS, is applied on analog line 80 to the set point input of temperature controller 100. Using the signal on line 80, temperature controller 100 generates the laser temperature feedback signal TEMP on line 82 for setting the output wavelength of laser 22 at the desired value in the domain of 1548.3 nm to 1548.8 nm.

Signal processor 50 of either embodiment can be operated in either a positive slope mode or a negative slope mode. Temperature controller 100 must be coordinated with the mode of operation of signal processor 50, so as to know how to interpret the signal of the control signal CS on line 80. As shown in FIG. 2A, signal processor 50' is in a positive slope mode and temperature controller 100 interprets a positive signal on line 80 as requiring a decrease in current on line 82. To operate in a negative slope mode, the inputs to operational amplifier 56 can be reversed or the interpretation by temperature controller 100 can be opposite to that of the positive slope mode.

Figure 3:
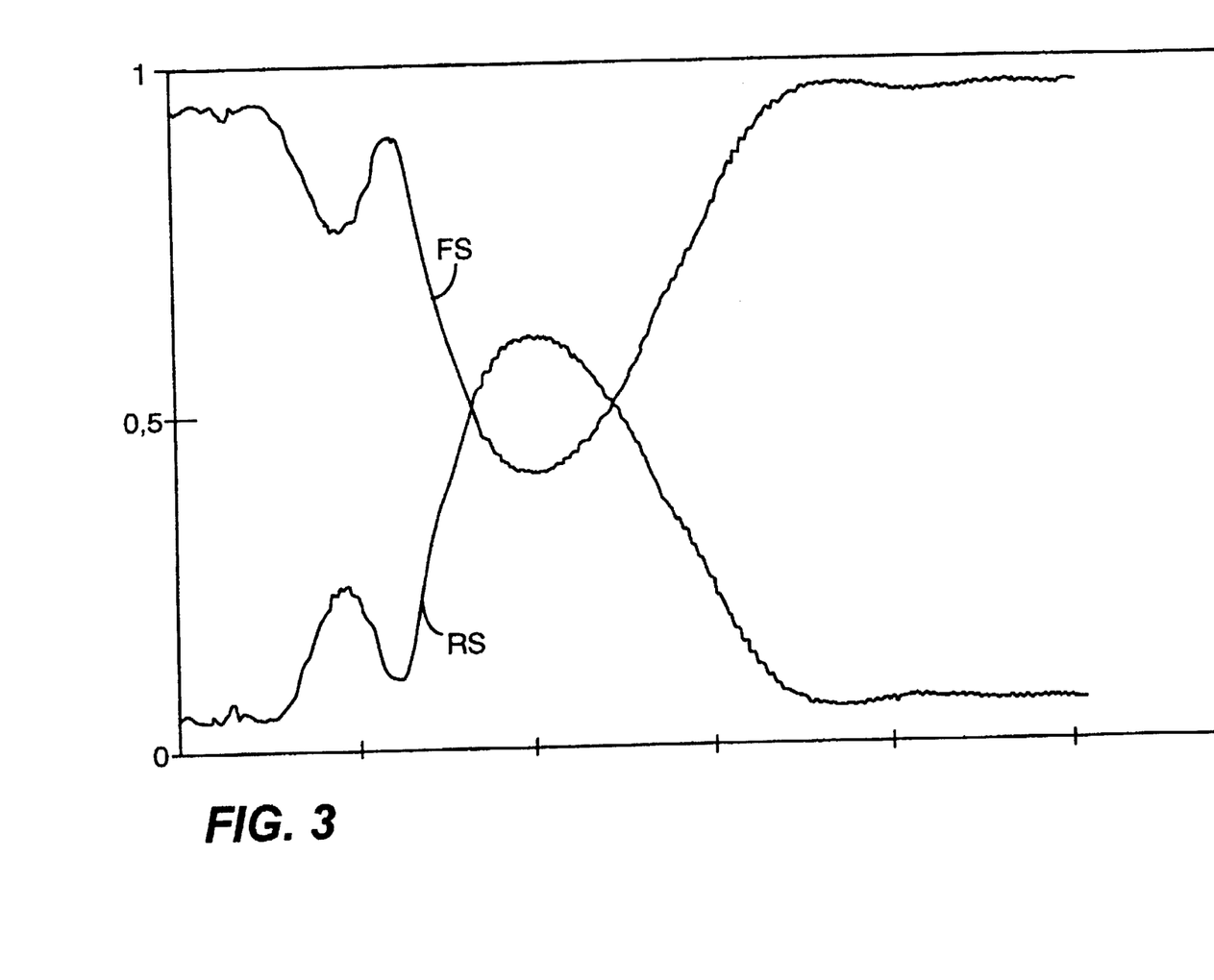
FIG. 3 is a graph of a filtered signal FS and a reflected signal RS which are utilized in the laser wavelength control system of FIG. 1.

FIG. 3 shows a graph of the filtered signal (see curve FS) as indicated by the output signal of filtered signal detector 52 and a graph of the reflected signal (see curve RS) as indicated by the output signal of reflected signal detector 54, both FS and RS being a function of wavelength. In FIG. 3, the domain extends from 1548.3 nm to 1548.8 nm with domain division markings being 0.1 nm per division markings. Graph curves FS and RS are representative of characteristics of the reflector/filter device 40, which asymmetrical shape of the characteristics for an optical fiber grating can be explained by the fact that the intensity distribution of the exposing UV-light is not flat. In this regard, see Mizrahi, V., and Sipe, J. E., "Optical Properties of Photosensitive Fiber Gratings", *J. Lightwave Technol.*, 1993, vol. 11.

Figure 4:
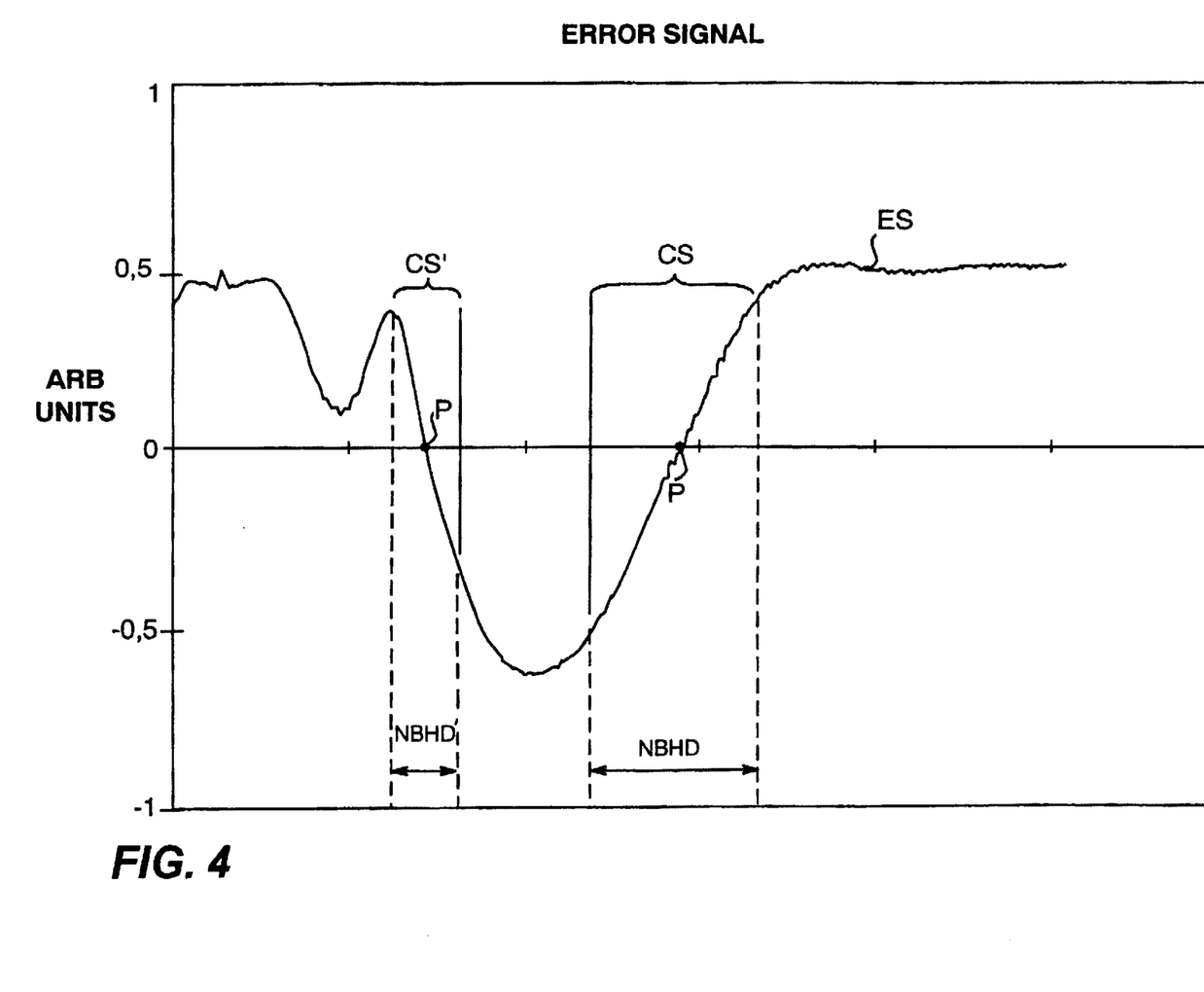
FIG. 4 is a graph showing an error signal generated by a signal processor of the laser wavelength control system of FIG. 1.

FIG. 4 shows a graph on an error signal ES when laser 22 is scanned in temperature over the wavelength domain of from 1548.3 nm to 1548.8 nm (i.e., over the same domain as FIG. 3). Error signal ES results from the calculation $FS(\lambda)-k*RS(\lambda)$ over the wavelength domain of FIG. 4. In comparing error signal ES of FIG. 5 relative to curves FS and RS of FIG. 4, it should be recalled that curve RS of FIG. 3 has yet to be multiplied by the gain constant k.

A segment of error signal ES is used for generation of control signal CS on line 80. In particular, control signal CS is generated in a neighborhood NBHD or "operational window" of smooth slope about a reference point P. Neighborhood NBHD is limited to a smooth slope in the transfer function of reflector/filter device 40. Reference point P is the point at which the control signal CS has a zero value (i.e., crosses the x axis of FIG. 4). The position of point P is a result of amplification of the FS and RS signals, reference again being made to the gain factor k in Equation 1. With proper adjustments, the point P is centralized in the active range (e.g. neighborhood NBHD). The adjustments are intended to compensate for a non-ideal grating transfer function. An ideal grating with 100% reflectivity and without losses would require no such adjustments.

It should be understood that one or more additional segments of error signal ES might qualify for control signal CS. That is, additional neighborhoods of smooth slope of the error signal ES might exist, and (accordingly) additional corresponding reference points in the additional neighborhood(s). For example, additional reference point P' in neighborhood NBHD' is shown in FIG. 4. Whereas in neighborhood NBHD control signal CS has a positive slope, in neighborhood NBHD' control signal CS' has a negative slope. Generally, utilization of a positive slope neighborhoods toward longer wavelengths is preferable, since with some types of gratings disturbances may occur with shorter wavelengths.

For initial calibration, the nominal operating wavelength of laser 22 is manually adjusted to the NBHD region of reflector/filter device 40 using an optical spectrum analyzer. In the NBHD region, the gain "k" of amplifier 55 is determined so that $FS(\lambda_o)=k*RS(\lambda_o)$, $\lambda_o$ being the locking wavelength. The temperature range of laser 22 is adjusted to cover 0.5 nm about the center wavelength of reflector/filter device 40 and filterslopes. That is, the maximum operating temperature range of laser 22 is adjusted to cover, 0.5 nanometer in corresponding wavelength, the whole fibre grating wavelength transfer function of reflector/filter device 40 with its center wavelength peak and slopes. This 0.5 nm range corresponds to approximately 5 degrees Centigrade change in the laser temperature. By adjusting the amplification on detector amplifiers 54 and 55, the reference point P can be fine tuned to the desired wavelength for laser 22. The wavelength slope is slightly more than 0.1 nm wide and an EA-DFB laser is easily pre-set in temperature within such window. Any ripple on this slope affects the feedback signal parameters and accuracy. In a normal optical transmission system (such as a SDH/SONET system, for example), the signal is always modulated, thereby giving broader line width and in general favoring stable temperature operation.

Figure 6:
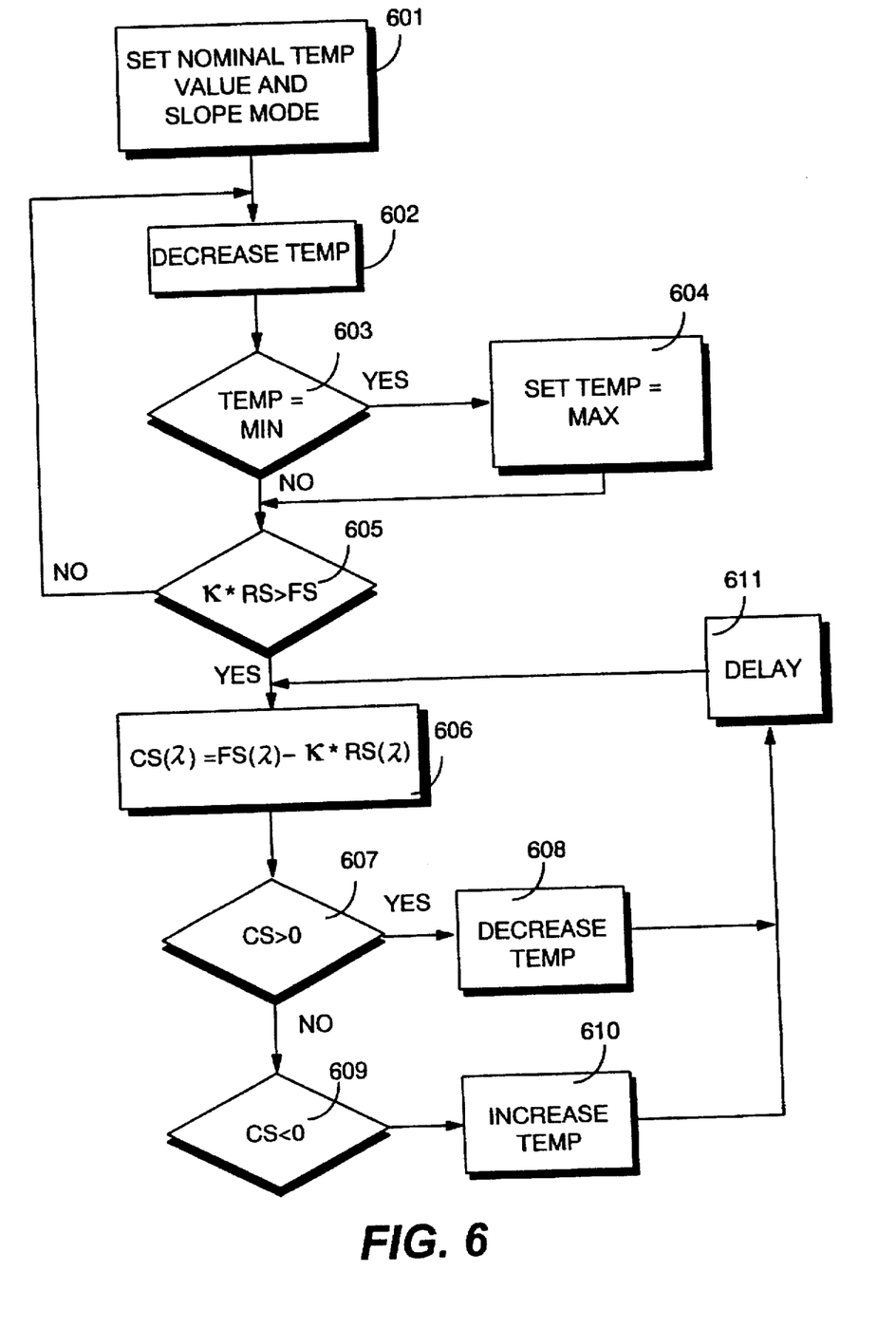
FIG. 6 is a flowchart showing steps executed by a controller included in the laser wavelength control system of FIG. 1.

FIG. 6 shows steps executed by controller 45 for controlling laser output wavelength of laser 22 (assuming a positive slope mode). Initially, the steps of FIG. 6 will be discussed in context of controller 45 of the embodiment of FIG. 2A. Initially, at step 601, upon start up, supervisor controller 120 selects a nominal default TEMP value to be applied on line 82 and applies a voltage signal indicative of such nominal TEMP value on line 130 to switch 110. Supervisor controller 120 issues a select signal on line 132 to cause switch 110 to select the voltage signal applied on line 130 to temperature converter 100.

In addition, at step 601, supervisor controller 120 applies a signal on line 133 to switch 57 for selecting either the positive slope mode or the negative slope mode. As indicated above, during the positive slope mode, the output of amplifier 54 is applied to the positive terminal of amplifier 56 and the output of amplifier 55 is applied to the negative terminal of amplifier 56. In a negative slope mode, the signal on line 133 would reverse such connections.

Then, at step 602, supervisor controller 120 determines a decremented TEMP value (decremented with respect to the TEMP value applied at step 601), and at step 603 determines whether such decremented value equals a minimum TEMP value. If the determination at step 603 is affirmative, at step 604 supervisor controller 120 sets a voltage on line 130 to correspond to a maximum TEMP value. Otherwise, the a voltage corresponding to the decremented TEMP value is applied on line 130 (via switch 110) to temperature converter 100.

Using, as appropriate, either the maximum TEMP value (as determined at step 604) or the decremented TEMP value (as determined at step 602), at step 605 supervisor processor 120 determines whether the magnitude (k*RF) exceeds the magnitude FS. Such determination is made on the basis of the signal applied on line 80 to supervisor processor 120. If the determination at step 605 is negative, supervisor processor 120 again executes step 602 to again decrement the TEMP value.

Assuming a positive determination at step 605, at step 606 signal processor 50 generates control signal CS using Equation 1 (i.e., CS=FS-k*RS) for application on line 80. If the value of control signal CS exceeds zero (as indicated by step 607), temperature converter 100 decreases the value of signal TEMP on line 82 (as indicated by step 608). Otherwise, if the value of control signal CS is less than zero (as indicated by step 609), temperature converter 100 increases the value of signal TEMP on line 82 (as indicated by step 610). As a result of any increase or decrease in the value of signal TEMP on line 82, the output of laser 22 changes. After a predetermined time delay (as indicated by step 611), signal processor 50 recalculates a new value for control signal CS (as indicated by looping back to step 606 in FIG. 6).

Thus, in the positive slope mode of operation, if the value of control signal CS on line 80 is positive (e.g., greater than zero volts), temperature controller 100 decreases the current of laser temperature feedback signal on line 82. Conversely, in the positive slope mode of operation, if the value of control signal CS on line 80 is negative (e.g., less than zero volts), temperature controller 100 increases the current of laser temperature feedback signal on line 82.

Operation of a negative slope mode can be deduced from the foregoing description of the positive slope mode.

With reference to the embodiment of FIG. 2B, steps of FIG. 6 said to be executed by supervisor controller 120 can be executed in consolidated fashion by microprocessor 60. Alternatively, the embodiment of FIG. 2B can also include a supervisor controller and/or slope mode selection switch 70 as illustrated in FIG. 2A.

Any wavelength tunable laser can be used for laser 22 provided that the laser optical line width is equal to or less than the reflector/filter slope, and provided that there is only one optical wavelength peak in the reflector/filter slope region. Moreover, as mentioned above, lasers other than EA-DFB lasers can be employed, such as a distributed Bragg reflector type laser, provided that terminals for wavelength tunability and/or absorption control.

A sensitivity of 0.0083 nm/C (1G Hz/C) was measured for the illustrated reflector/filter device 40. The reflector/filter device 40 is preferably an optical fiber grating having a smooth transfer function and a 50%–100% reflectivity. Reflector/filter device 40 should be fabricated to have proper temperature sensitivity and device coupling coefficient stability.

In the illustrated embodiment, reflector/filter device 40 is an optical fiber grating, and can be fabricated in accordance with conventional techniques on a glass, polymer, crystal, or semiconductor substrate. Preferably reflector/filter 40 is fabricated in optically and temperature stable materials such as glass or crystals. Optical properties and geometrical dimensions in quartz glass fibers are very stable with respect to high optical power levels and environmental temperature changes. Also, integrated optics on silicon, e.g., silica based waveguides on silicon, are usable.

The foregoing shows how to lock laser 22 to reflector/filter device 40. Significantly, reflector/filter device 40 is relatively insensitive to temperature and accordingly a good wavelength reference source. By "relatively insensitive", it is meant that reflector/filter device 40 has 0.0083 nanometer change or less per degree Centigrade. It is possible to further control the temperature of reflector/filter device 40 by packaging the same in a temperature controlled tube or the like.

In the illustrated embodiment, coupler/splitter 30 is a 2×2 coupler with ratio 1/99. Signal levels of detectors 52 and 54 are on the order of −30 dB.

Detectors 52 and 53 can be any optical detector which converts an optical signal into an electrical signal, such as a PIN diode type PRG1010/T made by Ericsson Components AB.

Amplifiers 54 and 55 are utilized to optimize and center the point of operation P in the neighborhood NBHD (see FIG. 4) by providing gain adjustments for both FS and RS signals with respect to the specific transfer characteristics of reflector/filter device 40. For example, if reflector/filter device 40 has less than 50% reflection, amplification adjustments are necessary via amplifiers 54 and 55 in order to obtain a crossover point in the FS/RS transfer characteristic. An ideal reflector/filter device 40 would not require amplifiers 54 and 55, although the amplifiers might be necessary for other reasons (e.g., for use of the signals by microprocessor 60).

A time delay (as indicated by step 311 in FIG. 6) is provided between adjustments of the laser temperature feedback signal on line 82. Such time delay can be incorporated in temperature controller 100, or between successive re-calculations of the control signal CS.

It will be understood by the man skilled in the art that there are long time constants when changing the temperature of laser 22 as compared to the much faster effect on wavelength which is induced by other factors such as change of laser current. Signal processor controller 50 takes into consideration, in execution of its program, such other feedback parameters as time constant and amplification.

Using the laser wavelength control system 20 of the present invention, wavelength stability for laser 22 was maintained within 10 pm (1.2 GHz). Such performance is better than that required for a 100 GHz spaced multichannel system carrying STM-16 signals.

Figure 5:
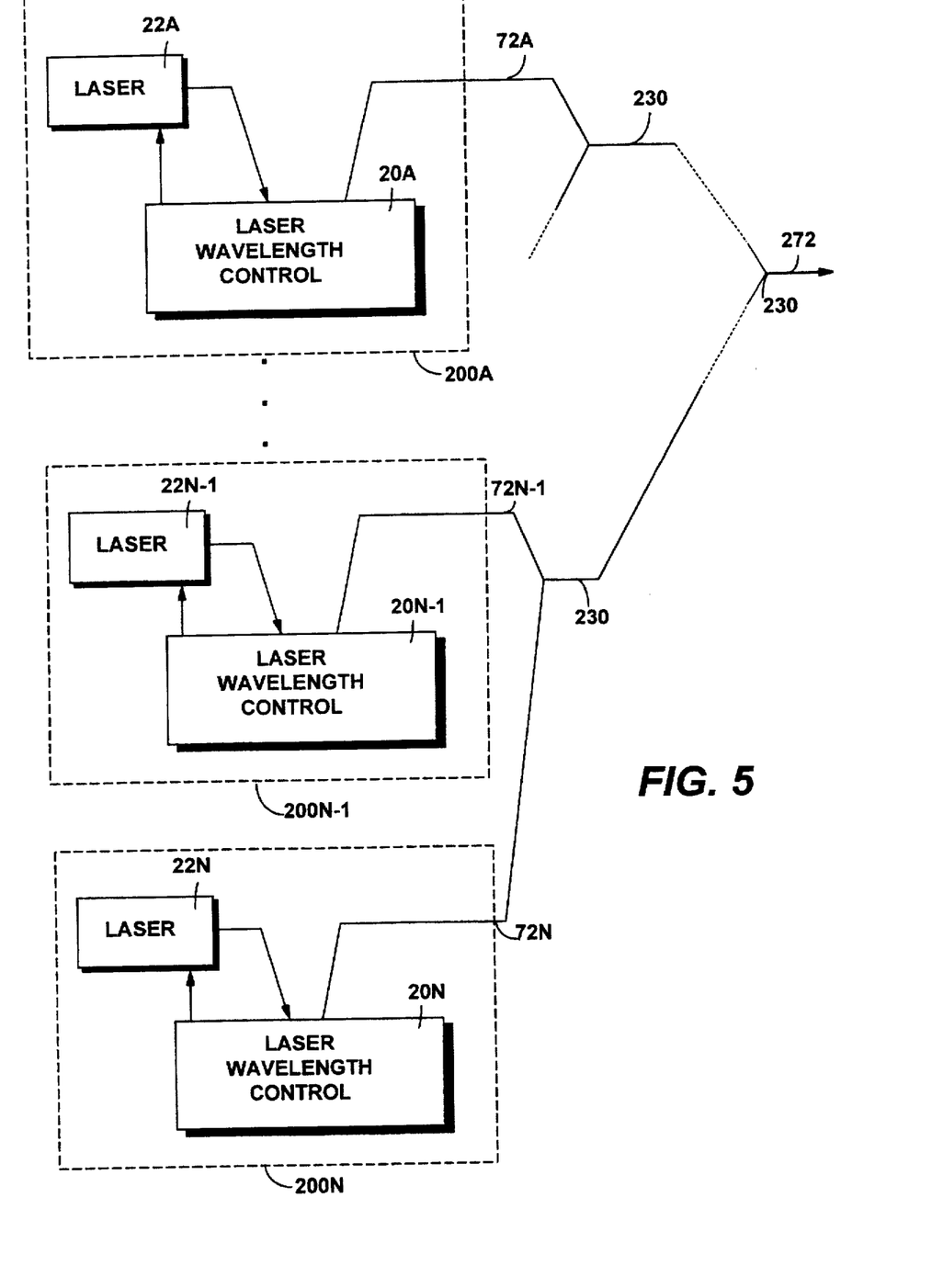
FIG. 5 is a schematic view of an optical multichannel transmission system which includes the laser wavelength control system of FIG. 1.

FIG. 5 shows an optical multichannel transmission system 200 which comprises a plurality of modular channel signal generators 200A–200N. Each channel generator 200A–200N includes a laser 22A–22N, respectively, as well as a laser wavelength control system 20A–20N, respectively. Each of the laser wavelength control systems 20A–20N are essentially as aforedescribed with respect to the embodiment of FIG. 1. Laser output beams 72A–72N are coupled by known techniques (e.g., by couplers 230) to result in a multichannel transmission on line 272. Each channel generator 200A–200N has its own local reference, resulting in modularity of the channel generators 200A–200N. Modularity permits flexibility in the choice of operating wavelength and also facilitates further integration. Moreover, channel management and channel protection features are simplified.

It should be understood that structures other than an optical fiber grating can be used for reflector/filter device 40, so long filtered and reflected signals are obtained and are utilizable for generating an error signal as described herein. For example, in another embodiment a multi-port etalon filter is employed as reflector/filter device 40. While such etalon filter may not be as stable as an optical fiber grating, the etalon filter does have other advantages such as periodicity of the optical interference in the etalon. Such periodicity is particularly beneficial in a multi-laser system wherein a plurality of identical etalons are employed. Each laser is locked to the different wavelength peaks in the equidistantly spaced comb of resonances.

With respect to the embodiment of FIG. 2A, it should further be understood that the function of switch 110 may be served by supervisor controller 120. In such case, supervisor controller 120 would apply, to temperature converter 100, either the analog value on line 80 or the analog value which otherwise would have applied on line 130.

While the invention has been particularly shown and described with reference to the preferred embodiments thereof, it will be understood by those skilled in the art that various alterations in form and detail may be made therein without departing from the spirit and scope of the invention.

The embodiments of the invention in which an exclusive property or privilege is claimed are defined as follows:

1. A laser wavelength control system for stabilizing laser output wavelength from a laser which generates laser output radiation, the system comprising:

a reflector/filter device upon which the laser output radiation is at least partially incident for yielding both a filter-transmitted signal and a reflected signal;

a controller which utilizes both the filter-transmitted signal and the reflected signal to generate a control signal for use in stabilizing the laser output wavelength;

wherein the controller generates the control signal based on a zero crossing point of the control signal in a neighborhood of smooth slope of the control signal.

2. The system of claim 1, wherein the controller comprises a temperature converter which uses the control signal to generate a laser temperature feedback signal for adjusting the laser output wavelength of the laser.

3. The system of claim 1, wherein the controller comprises a signal processor, and wherein the signal processor comprises:

a first detector for detecting the filter-transmitted signal;

a second detector for detecting the reflected signal; and an analog circuit which compares the filter-transmitted signal and the reflected signal for generation of the control signal.

4. The system of claim 1, wherein the controller comprises a signal processor, and wherein the signal processor comprises:

a first detector for detecting the filter-transmitted signal;

a second detector for detecting the reflected signal; and a digital processor which compares the filter-transmitted signal and the reflected signal for generation of the control signal.

5. The system of claim 1, wherein the reflector/filter device is an optical fiber grating.

6. A laser wavelength control method for stabilizing laser output wavelength, the method comprising:

directing laser output radiation from a laser to a reflector/filter device which yields both a filter-transmitted signal and a reflected signal;

utilizing both the filter-transmitted signal and reflected signal to generate a control signal;

using the control signal for stabilizing the output wavelength of the laser;

wherein the control signal is generated based on a zero crossing point of the control signal in a neighborhood of smooth slope of the control signal.

7. The method of claim 6, further comprising using the control signal to generate a laser temperature feedback signal for adjusting the laser output wavelength of the laser.

8. A laser wavelength control system for stabilizing laser output wavelength from a laser which generates laser output radiation, the system comprising:

a reflector/filter device upon which the laser output radiation is at least partially incident, the reflector/filter having a transfer function which yields both a filter-transmitted signal and a reflected signal;

a controller which utilizes both the filter-transmitted signal and the reflected signal to generate an error signal, the error signal in turn being utilized by the controller to generate a control signal having a zero-crossing point in a neighborhood of smooth slope of the transfer function, the controller using the control signal for stabilizing the laser output wavelength.

9. The system of claim 8, wherein the controller comprises a temperature converter which uses the control signal to generate a laser temperature feedback signal for adjusting the laser output wavelength of the laser.

10. The system of claim 8, wherein the controller comprises a signal processor, and wherein the signal processor comprises:

a first detector for detecting the filter-transmitted signal;

a second detector for detecting the reflected signal; and an analog circuit which compares the filter-transmitted signal and the reflected signal for generation of the control signal.

11. The system of claim 8, wherein the controller comprises a signal processor, and wherein the signal processor comprises:

a first detector for detecting the filter-transmitted signal;

a second detector for detecting the reflected signal; and a digital processor which compares the filter-transmitted signal and the reflected signal for generation of the control signal.

12. The system of claim 8, wherein the reflector/filter device is an optical fiber grating.

13. A laser wavelength control method for stabilizing laser output wavelength, the method comprising:

directing laser output radiation from a laser to a reflector/filter device, the reflector/filter device having a transfer function which yields both a filter-transmitted signal and a reflected signal;

utilizing both the filter-transmitted signal and reflected signal to generate an error signal;

utilizing the error signal to generate a control signal having a zero-crossing point in a neighborhood of smooth slope of the transfer function; and using the control signal for stabilizing the output wavelength of the laser.

14. The method of claim 13, further comprising using the control signal to generate a laser temperature feedback signal for adjusting the laser output wavelength of the laser.

* * * * *